(12) United States Patent  
Roh

(10) Patent No.: US 6,180,321 B1  
(45) Date of Patent: Jan. 30, 2001

(54) METHOD FOR PATTERNING A THIN FILM LAYER

(75) Inventor: Jae-Woo Roh, Seoul (KR)

(73) Assignee: Daewoo Electronics Co., Ltd., Seoul (KR)

( * ) Notice: Under 35 U.S.C. 154(b), the term of this patent shall be extended for 0 days.

(21) Appl. No.: 09/146,761

(22) Filed: Sep. 4, 1998

(30) Foreign Application Priority Data

Nov. 28, 1997 (KR) .................................................. 97-63676

(51) Int. Cl.$^7$ ....................................................... G03F 7/00
(52) U.S. Cl. .......................... 430/313; 430/396; 216/41; 438/706
(58) Field of Search ..................................... 430/312, 327, 430/322, 323, 396, 313; 216/41, 49; 438/706

(56) References Cited

U.S. PATENT DOCUMENTS 5,905,019 * 5/1999 Obszarny ............................. 430/327

FOREIGN PATENT DOCUMENTS 2198149 6/1988 (GB) .  
2292831 3/1996 (GB) .

* cited by examiner

*Primary Examiner*—Kathleen Duda  
(74) *Attorney, Agent, or Firm*—Pennie & Edmonds LLP

(57) ABSTRACT

A method for patterning a thin film layer into a predetermined configuration improves resolution thereof by exposing a partial depth "d" of a photoresist layer to a light beam. The patterning method includes the steps of: (a) preparing a semiconductor substrate with the thin film layer, an intermediate layer and a photoresist layer formed thereon, successively; (b) exposing a partial depth of the photoresist layer to a light beam; (c) removing the portion of the photoresist layer exposed to the light beam by using a solution to thereby obtain a patterned photoresist layer; (d) etching the intermediate layer by using the patterned photoresist layer as a mask; and (e) patterning the thin film layer into the predetermined configuration by using the etched intermediate layer as a mask.

12 Claims, 7 Drawing Sheets

METHOD FOR PATTERNING A THIN FILM LAYER

FIELD OF THE INVENTION

The present invention relates to a method for patterning a thin film layer; and, more particularly, to an improved method for patterning a thin film layer by exposing a partial depth of a photoresist layer to a light beam to reduce a minimum line width in the patterned thin film layer.

DESCRIPTION OF THE PRIOR ART

In FIGS. 1A and 1B, there are provided schematic cross sectional views illustrating a prior art method for patterning a thin film layer formed on a substrate.

As shown in FIG. 1A, the method for patterning the thin film layer 120 begins with the formation of the thin film layer 120 and a photoresist layer 130 on top of a substrate 110, successively. The thickness of the photoresist layer 130 is determined by the thickness of the thin film layer 120 and a ratio of etching rates between the photoresist layer 130 and the thin film layer 120. The notation "D" in FIG. 1A represents the thickness of the photoresist layer 130.

The thin film layer 120 made of, e.g., a dielectric material, is deposited on top of the substrate 110 by using, e.g., a chemical vapor deposition(CVD) method; and the photoresist layer 130 made of, e.g., a positive photoresist, is formed on top of the thin film layer 120 by using, e.g., a spin coating method. After the photoresist layer 130 is formed, a photomask 140 is aligned with the photoresist layer 130 at a distance of "S", wherein the notation "S" in FIG. 1A represents a distance between the photomask 140 and the top surface of the photoresist layer 130. The photomask 140 includes a transmitting region 142 and a non-transmitting region 144, wherein the transmitting region 142 is made of a light transmitting material, and the non-transmitting region 142 is made of a light non-transmitting material, e.g., Cr. When exposed to a light beam, a portion of the photoresist layer 130 under the transmitting region 142 becomes soluble in an appropriate solution and the remaining portion 132 of the photoresist layer 130 remains insoluble.

The portion of the photoresist layer 130 under the light transmitting region 142 of the photomask 140 is removed by using the appropriate solution, thereby allowing the remaining portion 132 of the photoresist layer 130 to serve as a mask for patterning the thin film layer 120. Subsequently, a part of the thin film layer 120 which is not covered by the remaining portion 132 of the photoresist layer 130 is removed, by using e.g., an ion milling or a reactive ion etching (RIE), to thereby produce a patterned thin film layer 122 as depicted in FIG. 1B. In this case, a minimum line width "W" which can be replicated in the patterned thin film layer 122 is given by:

$$W = \frac{3}{2}\sqrt{\lambda\left(S + \frac{D}{2}\right)}$$

wherein $\lambda$ is the wavelength of the light beam; S, the distance between the photomask 140 and the top surface of the photoresist layer 130; and D, the thickness of the photoresist layer 130.

One of the major shortcomings of the above-described method is that it is difficult to decrease the minimum line width "W" when the photoresist layer 130 becomes very thick due to a ratio of etching rates between the photoresist layer 130 and the thin film layer 120. As shown in the above-described equation, the minimum line width "W" is proportional to the square root of "D". Therefore, as the "D" increases, the larger the minimum line width "W" becomes larger due to the diffraction of the light beam.

Further, the interface between the photoresist layer 130 and the thin film layer 120 reflects the light beam transmitted through the photoresist layer 130 to the portion 134 of the photoresist layer 130. Therefore, the portion 134 of the photoresist layer 130 is exposed to the reflected light beam. The portion 134, which need not be removed, is removed during the process for removing the portion of the photoresist layer 130 under the transmitting region 142 of the photomask 140, which will, in turn, increase the minimum line width "W".

SUMMARY OF THE INVENTION

It is, therefore, a primary object of the present invention to provide a method for patterning a thin film layer into a predetermined configuration with a narrow minimum line width.

In accordance with the present invention, there is provided a method for patterning a thin film layer into a predetermined configuration for use in the manufacture of a semiconductor device, the method comprising the steps of: (a) preparing a substrate with the thin film layer, an intermediate layer and a photoresist layer formed thereon, successively; (b) exposing a light beam to a partial depth of the photoresist layer; (c) removing the portion of the photoresist layer exposed to the light beam by using a solution to thereby obtain a patterned photoresist layer; (d) etching the intermediate layer by using the patterned photoresist layer as a mask; and (e) etching the thin film layer into the predetermined configuration by using the etched intermediate layer as a mask.

BRIEF DESCRIPTION OF THE DRAWINGS

The above and other objects and features of the present invention will become apparent from the following description of preferred embodiments, when given in conjunction with the accompanying drawings, wherein.

DETAILED DESCRIPTION OF THE PREFERRED EMBODIMENTS

Referring to FIGS. 2A to 2G, there are shown schematic cross sectional views setting forth the steps involved in patterning a thin film layer in accordance with a first preferred embodiment of the present invention.

Figure 1A:
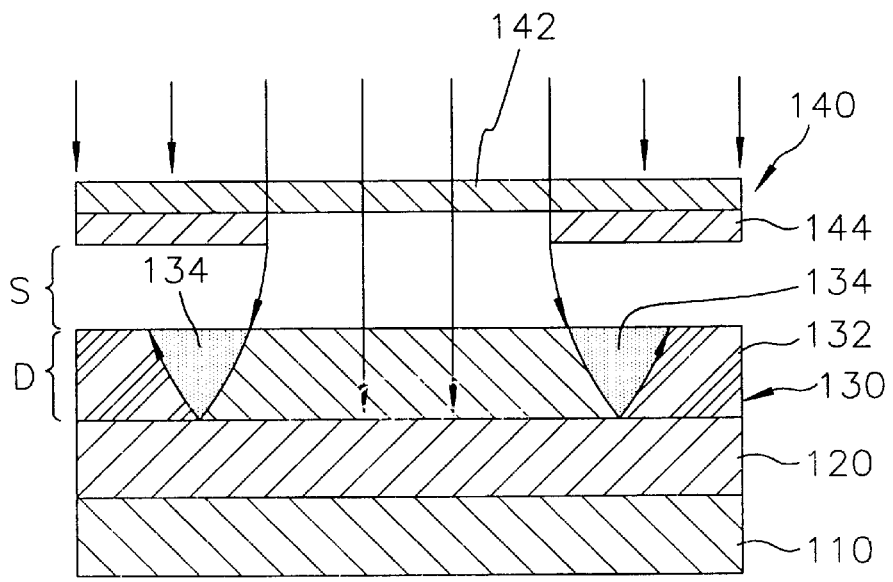
FIG. 1A represents a cross-sectional view showing an arrangement between a photomask and a semiconductor substrate in a prior art patterning method.
Figure 1B:
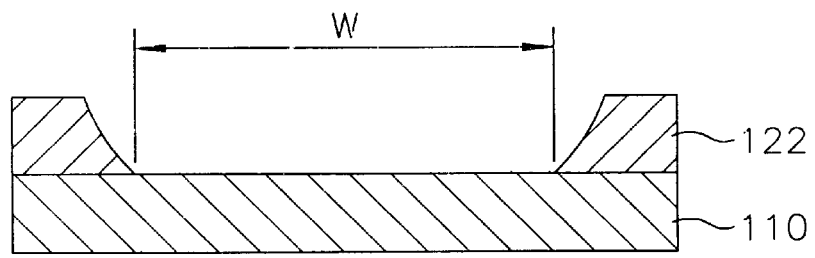
FIG. 1B depicts a cross-sectional view of a patterned thin film layer obtained by using the prior art patterning method.
Figure 2A:
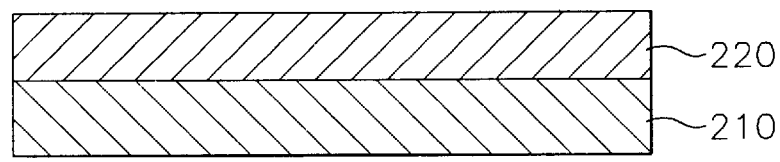
FIGS. 2A to 2G provide schematic cross sectional views illustrating a method for patterning a thin film layer in accordance with a first preferred embodiment of the present invention.

The process for patterning the thin film layer 220 begins with preparing a substrate 210, made of a material, e.g., Si, on which the thin film layer 220 is formed by using a method such as an evaporation method or a sputtering method, as shown in FIG. 2A.

Figure 2B:
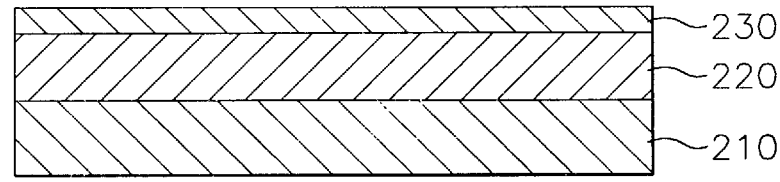

Subsequently, an intermediate layer 230 is formed on top of the thin film layer 220 by using a method such as an evaporation method or a sputtering method, as shown in FIG. 2B. The material type and the thickness of the intermediate layer 230 can be determined by those of the thin film layer 220 and an etchant gas to be used in following processes.

Figure 2C:
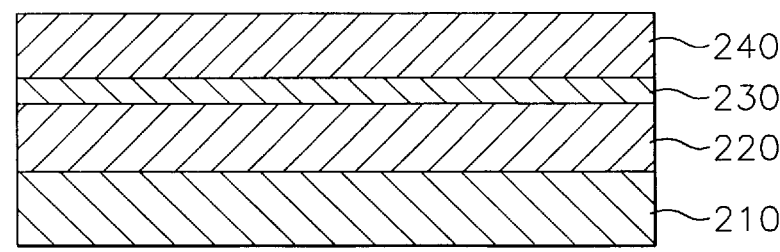

A photoresist layer 240 is formed on top of the intermediate layer 230 by using a method such as a spin coating method as shown in FIG. 2C. In the first preferred embodiment of the present invention, if the thin film layer 220 is made of a material such as silicone dioxide($SiO_2$), a metallic material such as titanium(Ti) can be used as the intermediate layer 230 to reduce the thickness thereof.

Figure 2D:
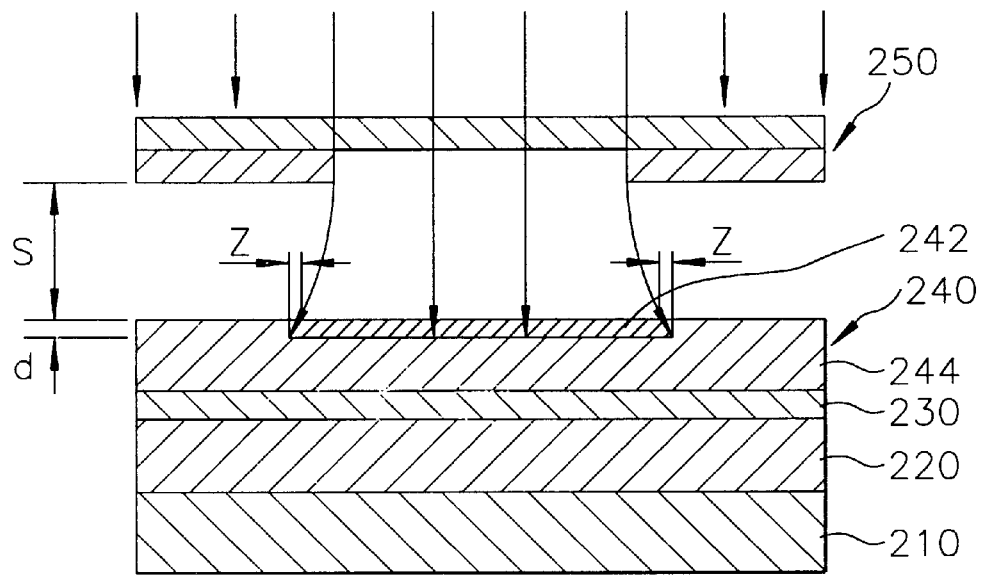

In a next step, as shown in FIG. 2D, a photomask 250 is aligned with the photoresist layer 240 at a distance of "S". The photomask 250 includes a transmitting and a non-transmitting regions. The light beam transmitted through the transmitting region of the photomask 250 exposes the photoresist layer 240 to a partial depth of "d", thereby a portion 242 of the photoresist layer 240 under the transmitting region of the photomask 250 becoming soluble in an appropriate solution and a remaining portion 244 of the photoresist layer 240 remains to be insoluble. The partial depth "d" can be controlled by changing the light beam intensity. The diffraction effect of the light beam penetrated only up to the partial depth "d" is smaller than that of the light beam transmitted to the top of the intermediate layer 230.

As shown in FIG. 2D, as the partial depth "d" increases, a width "Z" also increases due to the diffraction effect of the light beam. Further, since the light beam does not reach to the top of the intermediate layer 230, there is no reflected light beam at the interface between the photoresist layer 240 and the intermediate layer 230. Thereafter, the portion 242 of the photoresist layer 240 is removed by using an appropriate solution thereby leaving the remaining portion 244 of the photoresist layer 240 on top of the intermediate layer 230.

Figure 2E:
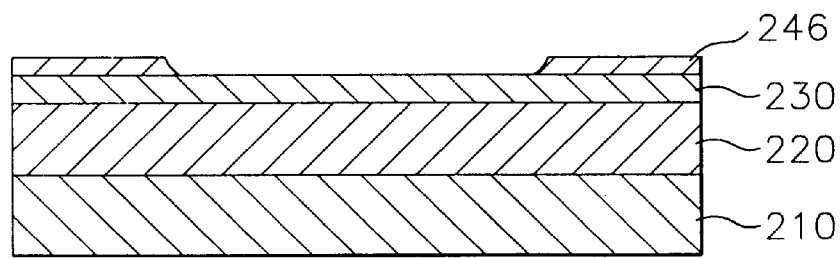

In a following step, as shown in FIG. 2E, the remaining portion 244 of the photoresist layer 240 is etched by using, e.g., a reactive ion etching(RIE), until the top of the intermediate layer 230 is uncovered, to thereby produce an etched photoresist layer 246.

Figure 2F:
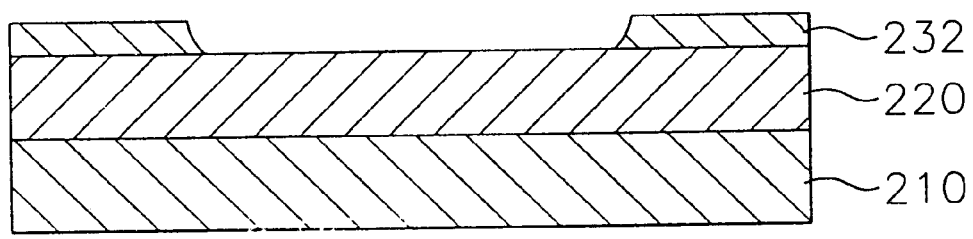

A part of the intermediate layer 230 under the etched photoresist layer 246 is etched by using, e.g., RIE, until the top of the thin film layer 220 is uncovered, to thereby produce an etched intermediate layer 232, as shown in FIG. 2F. The RIE is performed with a first etchant gas capable of etching the intermediate layer 230 faster than the photoresist layer 240 so as to reduce the partial depth "d". In case that the photoresist layer 240 is a positive type and the intermediate layer 230 is made of Ti, the first etchant gas can be made of argon gas and chlorine($Cl_2$). The partial depth "d" is determined by the thickness of the intermediate layer 230 and an etching ratio between the photoresist layer 240 and the intermediate layer 230. The etching ratio is determined by a composition ratio of $Cl_2$ to argon gas. For example, if the ratio of $Cl_2$ to argon gas is selected approximately 1:1, the thickness of the Ti intermediate layer 230 is approximately three times the partial depth "d" of the photoresist layer 240.

The photoresist layer 240 may be directly deposited on top of the thin film layer 220. In this case, if the photoresist layer 240 is the positive type and the thin film layer 220 is made of Ti, another etchant gas, e.g., composed of carbon tetrafluoride($CF_4$) and argon(Ar) gas, will be used for etching the thin film layer 220 by using the etched photoresist layer 246 as a mask. A ratio between the thickness of the thin film layer 220 and the partial depth "d" can also be varied by changing an etching ratio between the photoresist layer 240 and the thin film layer 220, wherein the etching ratio is determined by a composition ratio of $CF_4$ to argon gas. For example, if the ratio of $CF_4$ to Ar gas is selected approximately 1:1, the thickness of the $SiO_2$ thin film layer 220 is approximately four times the partial depth "d".

However, if an etchant capable of etching a thin film layer to be etched faster than a photoresist layer does not exists, it would be practical to directly deposit the photoresist layer on top of the thin film layer due to the increment of the thickness of the photoresist layer.

Figure 2G:
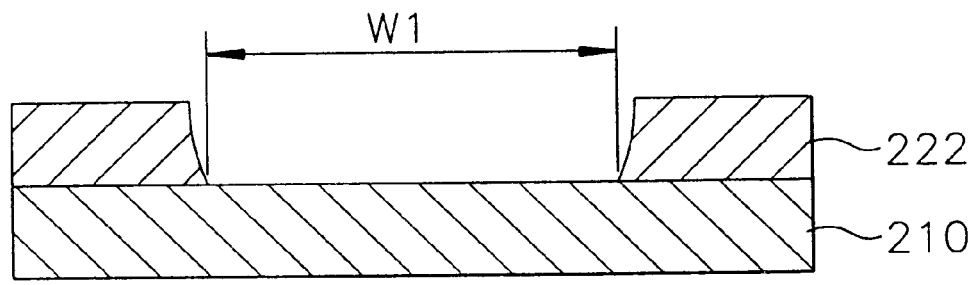

Subsequently, as depicted in FIG. 2G, a part of the thin film layer 220 not covered by the etched intermediated layer 232 is removed by, e.g., RIE, thereby producing a patterned thin film layer 222. In this step, the RIE is performed by using a second etchant gas capable of etching the thin film layer 220 faster than the intermediate layer 230. If the intermediate layer 230 is made of Ti and the thin film layer 220 is made of $SiO_2$, the second etchant gas is made of argon gas and $CF_4$. A ratio between the thickness of the intermediate layer 230 and that of the thin film layer 220 can be varied by changing an etching ratio between the intermediate layer 230 and the thin film layer 220, wherein the etching ratio is determined by a composition ratio of $CF_4$ to argon gas.

If residue of the etched intermediate layer 232 remains on top of the patterned thin film layer 222, then it can be removed by using an appropriate dissolving agent or a mechanical polishing method.

In accordance with the first preferred embodiment of the invention, the method patterns the thin film layer 220 into a predetermined configuration with a minimum line width "W1" narrower than that of the prior art patterning method. This is achieved by exposing a partial depth "d" of the photoresist layer 240 to a light beam, which makes the minimum line width "W1" decrease in patterning the thin film layer 220 since the light beam is not reflected from the interface between the photoresist layer and the intermediate layer. In addition, the present invention is capable of further decreasing the partial depth "d" by utilizing the intermediate layer 230, which will, in turn, further reduce the minimum line width W1.

Referring to FIGS. 3A to 3G, there are shown schematic cross sectional views setting forth the steps involved in patterning a thin film layer in accordance with a second preferred embodiment of the present invention.

Figure 3A:
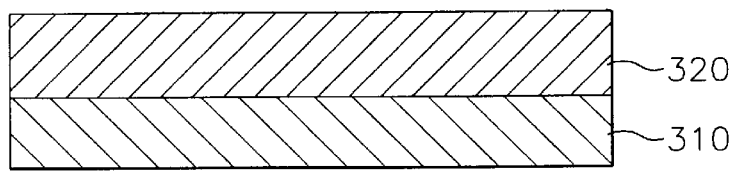
FIGS. 3A to 3G provide schematic cross sectional views illustrating a method for patterning a thin film layer in accordance with a second preferred embodiment of the present invention.

The process for patterning the thin film layer 320 begins with preparing a substrate 310, made of a material, e.g., Si, on which a thin film layer 320 is formed by using a method such as an evaporation method or a sputtering method, as shown in FIG. 3A.

Figure 3B:
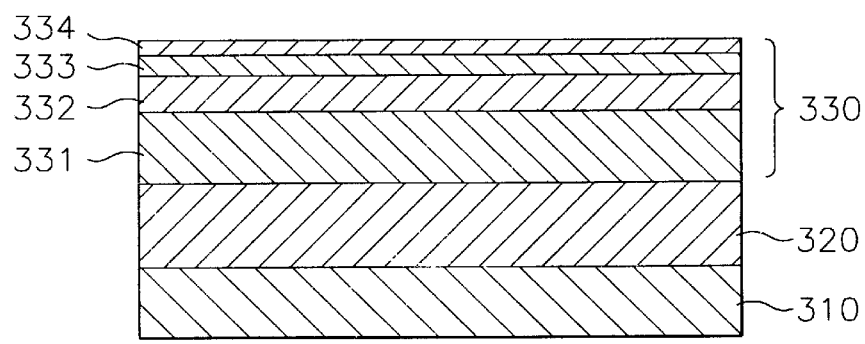

Subsequently, an intermediate layer 330 is formed on top of the thin film layer 320 by using a method such as an evaporation method or a sputtering method, as shown in FIG. 3B. The intermediate layer 330 is a stack of N number of layers, e.g., 4 layers 331–334. In this case, a thickness of each layer in the intermediate layer 330 decreases as its distance from the thin film layer 320 increases. The material types and the thicknesses of the layers 331–334 can be determined by those of the thin film layer 320 and the layers 331–334 and etchant gases to be used in following processes.

Figure 3C:
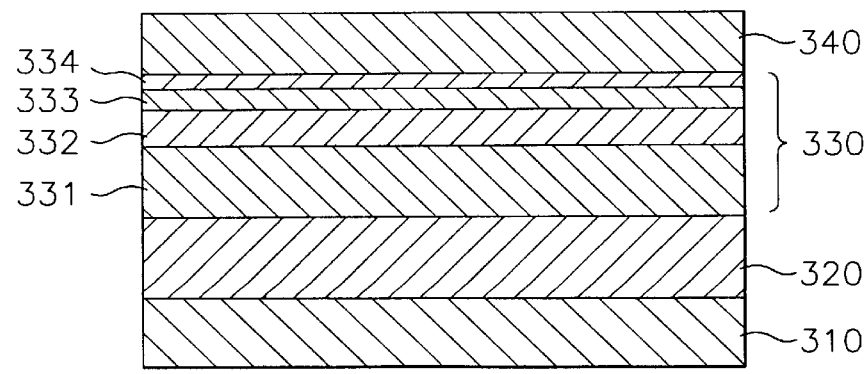

A photoresist layer 340 is formed on top of the top layer 334 by using a method such as a spin coating method as shown in FIG. 3C.

Figure 3D:
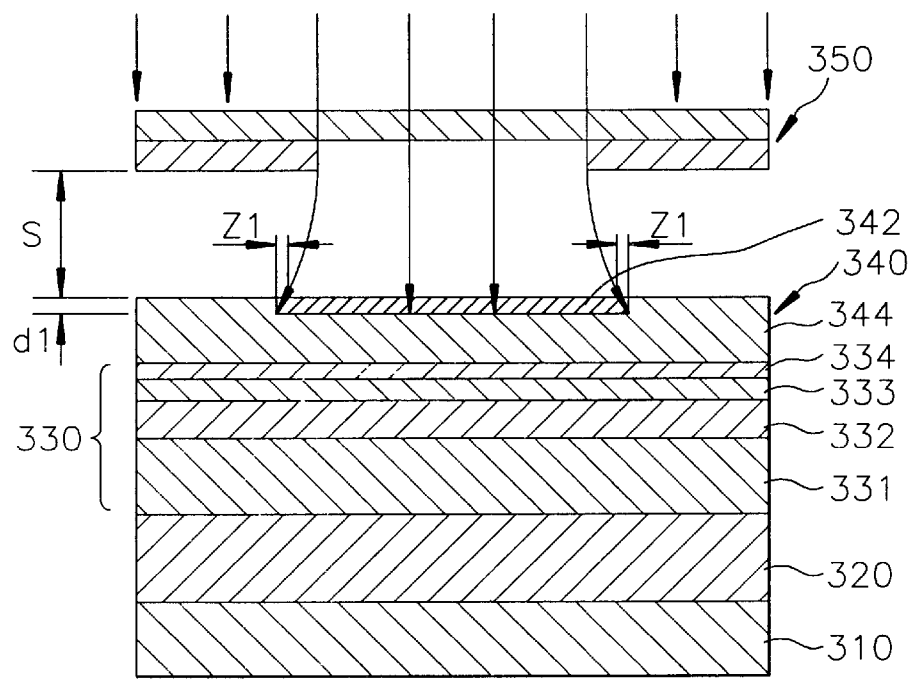

In a next step, as shown in FIG. 3D, the photomask 350 is aligned with the photoresist layer 340 at a distance of "S". The photomask 350 includes a transmitting and a non-transmitting regions. The light beam transmitted through the transmitting region of the photomask 350 penetrates into the photoresist layer 340 as far as a partial depth of "d". The light beam is controlled by the same method of the first preferred embodiment.

Figure 3E:
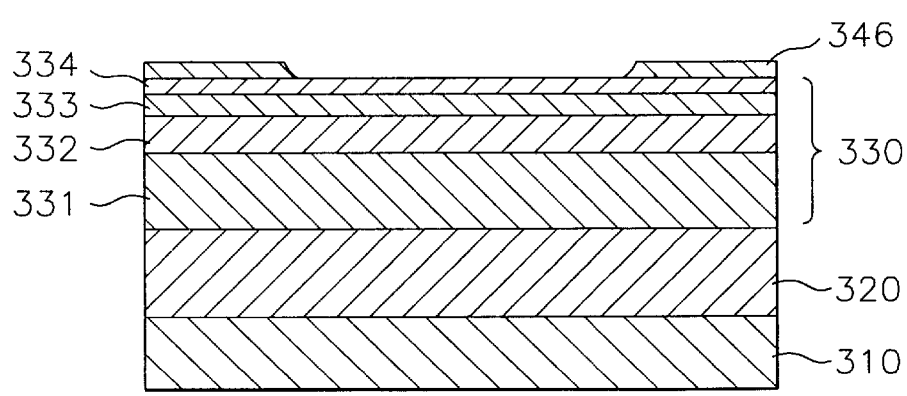

In a following step, as shown in FIG. 3E, the remaining portion 344 of the photoresist layer 340 is etched by using, e.g., RIE, until top of the layer 334 is uncovered, to thereby produce an etched photoresist layer 346.

Figure 3F:
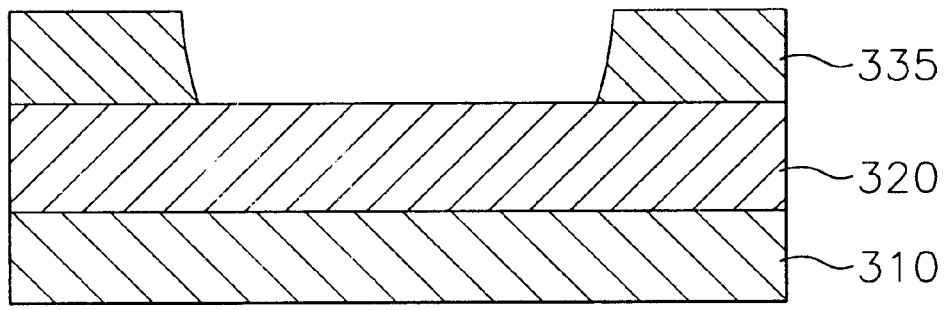

A part of the layer 334 under the etched photoresist layer 346 is etched by using, e.g., a reactive ion etching(RIE) until a top of the layer 333 is uncovered. The layer 333 is then etched by using the remained part of the layer 334 as a mask. Thereafter, the layer 332 is etched by using the remaining part of the layer 333 as a mask. Finally, the layer 331 is etched by using the remaining part of the layer 332 as a mask to thereby obtain an etched layer 335 as shown in FIG. 3F.

In the second preferred embodiment, if the thin film layer 320 and the layers 332, 334 are made of $SiO_2$ and the layers 331, 333 are made of Ti, a third etchant gas capable of etching the layer 334 faster than the photoresist layer 340 is selected to reduce the partial depth "d1" during the process for etching the layer 334. In case that the photoresist layer 340 is a positive type, the third etchant gas can be made of argon gas and $CF_4$. The partial depth "d1" is determined by the thickness of the layer 334 and an etching ratio between the photoresist layer 340 and the layer 334, wherein the etching ratio is determined by a composition ratio of $CF_4$ to argon gas. For example, when the ratio of $CF_4$ to argon gas is approximately 1:1, the thickness of the layer 334 is approximately four times the partial depth "d1" of the photoresist layer 340.

In order to further reduce the partial depth "d1", a fourth etchant gas capable of etching the layers 333, 331 faster than the layers 334, 332 is selected while etching the layers 333, 331, respectively; and the fifth etchant gas capable of etching the layer 332 faster than the layer 333 is selected while etching the layer 332. In the second preferred embodiment, the layers 331, 333 are made of Ti, and the thin film layer 320 and the layers 332, 334 are made of $SiO_2$, the fourth etchant gas is made of $Cl_2$ and argon gas, and the fifth etchant gas is made of $CF_4$ and Ar gas. A ratio between the thickness of each layer can also be varied by changing an etching ratio therebetween.

Figure 3G:
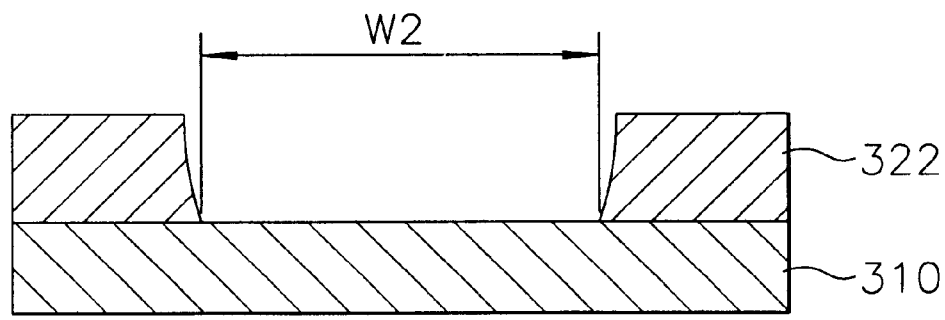

Subsequently, a part of the thin film layer 320 not covered by the etched layer 335 is removed by using, e.g., a RIE, thereby producing a patterned thin film layer 322, as depicted in FIG. 3G. In this step, the RIE is performed by using the fifth etchant gas capable of etching the thin film layer 320 faster than the layer 331.

In comparison with the first preferred embodiment, the second embodiment can further reduce the minimum line width "W2" by utilizing the intermediate layer 330 made of a stack of layers. In this case, a thickness of each layer in the intermediate layer decreases as its distance. This is achieved by utilizing a fourth and a fifth etchant gases, alternately.

While the present invention has been described with respect to certain preferred embodiments only, other modifications and variations may be made without departing from the scope and spirit of the present invention as set forth in the following claims.

What is claimed is:

1. A method for patterning a thin film layer into a predetermined configuration for use in the manufacture of a semiconductor device, the method comprising the steps of:

(a) preparing a substrate with the thin film layer and a photoresist layer formed thereon, successively;

(b) exposing a partial depth of the photoresist layer to a light beam;

(c) removing the portion of the photoresist layer exposed to the light beam by using a solution to thereby obtain a patterned photoresist layer; and (d) patterning the thin film layer into the predetermined configuration by using the patterned photoresist layer as a mask, wherein a thickness of the partial depth is determined by that of the thin film layer.

2. The method of claim 1, wherein said patterning step (d) is carried out by using a reactive ion etching.

3. The method of claim 2, wherein the reactive ion etching is performed by an etchant capable of etching the thin film layer faster than the photoresist layer so as to reduce the thickness of the partial depth.

4. The method of claim 3, wherein a thickness ratio between the thin film layer and the partial depth of the photoresist layer is varied by changing a composition ratio of the etchant.

5. A method for patterning a thin film layer into a predetermined configuration, the method comprising the steps of:

(a) preparing a substrate with the thin film layer, an intermediate layer and a photoresist layer formed thereon, successively;

(b) exposing a partial depth of the photoresist layer to a light beam;

(c) removing the portion of the photoresist layer exposed to the light beam by using a solution to thereby obtain a patterned photoresist layer;

(d) etching the intermediate layer by using the patterned photoresist layer as a mask; and (e) patterning the thin film layer into the predetermined configuration by using the etched intermediate layer as a mask.

6. The method of claim 5, wherein a thickness of the partial depth is determined by that of the intermediate layer.

7. The method of claim 6, wherein said etching step (d) is carried out by a reactive ion etching.

8. The method of claim 7, wherein the reactive ion etching is performed by a first etchant capable of etching the intermediate layer faster than the photoresist layer so as to reduce the thickness of the partial depth.

9. The method of claim 8, wherein said patterning step (e) is carried out by a reactive ion etching, wherein the reactive ion etching is performed by a second etchant capable of etching the thin film layer faster than the intermediate layer.

10. The method of claim 5, wherein the intermediate layer is made of N number of layers which are made by alternately stacking a first and a second layers in order to further reduce the thickness of the partial depth of the photoresist layer exposed to the light beam.

11. The method of claim 10, wherein a thickness of each layer in the intermediate layer decreases as its distance from the thin film increases.

12. The method of claim 11, wherein the intermediate layer is etched by using a reactive ion etching with a first and a second etchants, alternately, the first etchant being capable of etching the second layer faster than the first layer and the second etchant being capable of etching the first layer faster than the second layer.

* * * * *